United States Patent
Park et al.

(10) Patent No.: US 7,723,918 B2
(45) Date of Patent: May 25, 2010

(54) PLASMA DISPLAY APPARATUS WITH ANGLE FORMED BY PATTERN UNITS

(75) Inventors: Ki Rack Park, Kyungsangbuk-do (KR); Jong Woon Bae, Gumi-si (KR); Seong Hwan Ryu, Gumi-si (KR); Yu Park, Seoul (KR); Jun Hwan Ju, Kyungsangnam-do (KR); Hun Gun Park, Kyungsangbuk-do (KR)

(73) Assignee: LG Electronics Inc., Seoul (KR)

( * ) Notice: Subject to any disclaimer, the term of this patent is extended or adjusted under 35 U.S.C. 154(b) by 700 days.

(21) Appl. No.: 11/652,672

(22) Filed: Jan. 12, 2007

(65) Prior Publication Data

US 2008/0018247 A1 Jan. 24, 2008

(30) Foreign Application Priority Data

Jul. 19, 2006 (KR) .................. 10-2006-0067530
Aug. 22, 2006 (KR) .................. 10-2006-0079252
Sep. 22, 2006 (KR) .................. 10-2006-0092490

(51) Int. Cl.
*H01J 17/49* (2006.01)
(52) U.S. Cl. ............................ 313/582; 313/112
(58) Field of Classification Search ......... 313/582–587, 313/112; 359/590, 885
See application file for complete search history.

(56) References Cited

U.S. PATENT DOCUMENTS

| 2006/0145578 | A1* | 7/2006 | Park et al. ............. 313/112 |
|---|---|---|---|
| 2006/0250064 | A1* | 11/2006 | Park et al. ............. 313/112 |
| 2007/0075641 | A1* | 4/2007 | Yu ........................ 313/587 |
| 2007/0090762 | A1* | 4/2007 | Hori et al. ............. 313/587 |
| 2007/0120485 | A1* | 5/2007 | Kim ...................... 313/582 |
| 2007/0152555 | A1* | 7/2007 | Park et al. ............. 313/112 |
| 2008/0030134 | A1* | 2/2008 | Ryu et al. .............. 313/582 |
| 2008/0036378 | A1* | 2/2008 | Ryu et al. .............. 313/582 |

FOREIGN PATENT DOCUMENTS

EP        1 677 336 A2    7/2006
KR       10-0579713 B1    5/2006

OTHER PUBLICATIONS

European Search Report dated Sep. 21, 2009.

* cited by examiner

*Primary Examiner*—Karabi Guharay
*Assistant Examiner*—Kevin Quarterman
(74) *Attorney, Agent, or Firm*—Ked & Associates, LLP

(57) ABSTRACT

The present invention relates to a plasma display apparatus. The plasma display apparatus includes a PDP, and a filter formed at the front of the panel. The filter includes an external light shielding sheet including a first base unit, and first pattern units formed in the first base unit, and an EMI shielding sheet including second pattern units. A thickness of the external light shielding sheet is 1.01 to 2.25 times greater than a height of each of the first pattern units, and an angle formed by the first pattern units and the second pattern units is set in the range of 20 to 65 degrees. Thereby, external light can be shielded and an EMI shielding effect can be improved.

37 Claims, 13 Drawing Sheets

PLASMA DISPLAY APPARATUS WITH ANGLE FORMED BY PATTERN UNITS

TECHNICAL FIELD

The present invention relates, in general, to a plasma display apparatus, and more particularly, to a plasma display apparatus in which an external light shielding sheet is disposed at the front or rear of a panel in order to block external light incident from the outside of the panel, thereby improving the bright and dark room contrast of the panel and maintaining luminance.

BACKGROUND ART

A Plasma Display Panel (hereinafter, referred to as a "PDP") is an apparatus configured to generate discharge by applying voltage to electrodes disposed in discharge spaces and to display an image including characters and/or graphics by exciting phosphors with plasma generated during the discharge of gas. The PDP is advantageous in that it can be made large, light and thin, can provide a wide viewing angle in all directions, and can implement full colors and high luminance.

In the PDP constructed above, when a black image is implemented, external light is reflected on the front of the panel due to white-based phosphor exposed on a lower plate of the panel. Therefore, a problem arises because a black image is recognized as a bright-based dark color, resulting in a lowered contract.

DISCLOSURE

Technical Problem

The present invention has been developed in an effort to provide a filter having the advantages of preventing the reflection of light by effectively shielding external light incident on a panel, significantly enhancing bright and dark room contrast of a PDP, improving the luminance of the panel, and reducing a Moire phenomenon, and a plasma display apparatus using the same.

Technical Solution

To this end, a plasma display apparatus according to an embodiment of the present invention includes a PDP, and a filter formed at the front of the panel. The filter includes an external light shielding sheet including a first base unit, and first pattern units formed in the first base unit, and an EMI shielding sheet including second pattern units.

Preferably, a thickness of the external light shielding sheet is 1.01 to 2.25 times greater than a height of each of the first pattern units, and an angle formed by the first pattern units and the second pattern units is set in the range of 20 to 65 degrees.

A plasma display apparatus according to anther embodiment of the present invention includes a PDP, and a filter formed at the front of the panel. The filter includes an external light shielding sheet including a first base unit, and first pattern units formed in the first base unit, and an EMI shielding sheet including second pattern units and third pattern units. The second and third pattern units cross each other, an angle formed by the first pattern unit and the second pattern unit ranges from 20 to 60 degrees, and an angle formed by the first pattern units and the third pattern unit ranges from 28 to 65 degrees.

A filter according to an embodiment of the present invention includes an external light shielding sheet including a first base unit, and first pattern units formed in the first base unit, and an EMI shielding sheet including second pattern units. A thickness of the external light shielding sheet is 1.01 to 2.25 times greater than a height of each of the first pattern units. An angle formed by the first pattern units and the second pattern units is set in the range of 20 to 65 degrees.

A filter according to another embodiment of the present invention includes an external light shielding sheet including a first base unit, and first pattern units formed in the first base unit, and an EMI shielding sheet including second pattern units and third pattern units. The second and third pattern units cross each other, an angle formed by the first pattern unit and the second pattern unit ranges from 20 to 60 degrees, and an angle formed by the first pattern units and the third pattern unit ranges from 28 to 65 degrees.

Advantageous Effects

In the plasma display apparatus of the present invention, an external light-shielding sheet configured to absorb and block externally incident light to the greatest extent is disposed at the front of a panel. It is therefore possible to effectively implement a black image, and improve bright and dark room contrast. Furthermore, since the pattern of the external light shielding sheet is formed at a tilt angle, the occurrence of the Moire phenomenon can be reduced. Incidentally, external light can be blocked and an Electromagnetic Interference (EMI) shielding effect can be improved since an EMI shielding sheet of a mesh fashion is attached to the external light shielding sheet.

MODE FOR INVENTION

Figure 1:
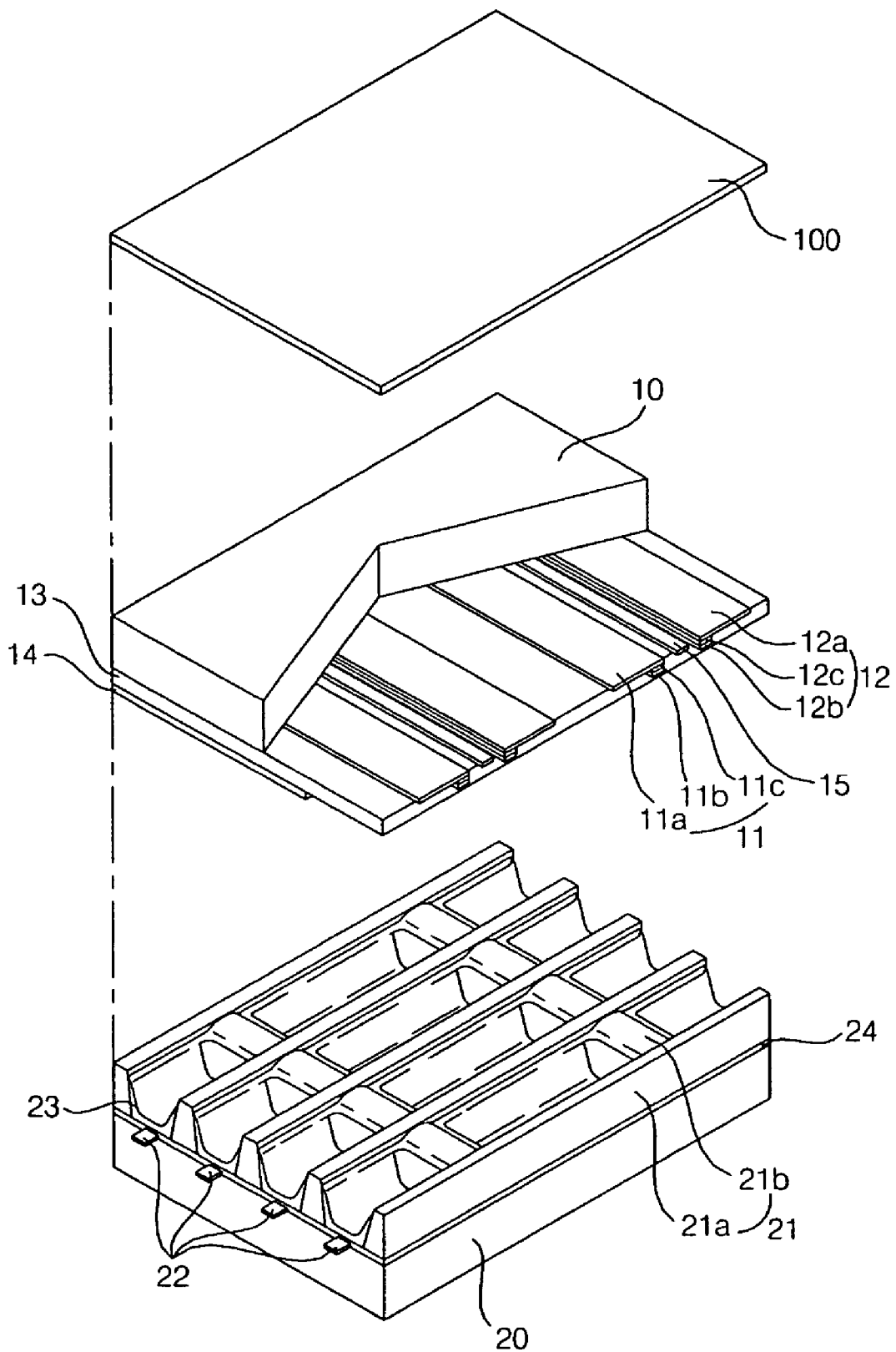
FIG. 1 is a perspective view illustrating an embodiment of the construction of a PDP according to an embodiment of the present invention.

The present invention will now be described in detail in connection with specific embodiments with reference to FIGS. 1 to 21. FIG. 1 is a perspective view illustrating an embodiment of the construction of a PDP according to an embodiment of the present invention.

Referring to FIG. 1, the PDP includes a scan electrode 11 and a sustain electrode 12 (i.e., a sustain electrode pair) both of which are formed on a front substrate 10, and address electrodes 22 formed on a rear substrate 20.

The sustain electrode pair 11 and 12 includes transparent electrodes 11a and 12a, and bus electrodes 11b and 12b. The transparent electrodes 11a and 12a are generally formed of Indium-Tin-Oxide (ITO). The bus electrodes 11b and 12b may be formed using metal, such as silver (Ag) or chrome (Cr), a stack of Cr/copper (Cu)/Cr, or a stack of Cr/aluminum (Al)/Cr. The bus electrodes 11b and 12b are formed on the transparent electrodes 11a and 12a and serve to reduce a voltage drop caused by the transparent electrodes 11a and 12a having a high resistance.

Meanwhile, the sustain electrode pair 11 and 12 according to an embodiment of the present invention may have a structure in which the transparent electrodes 11a and 12a and the bus electrodes 11b and 12b are laminated, or include only the bus electrodes 11b and 12b without the transparent electrodes 11a and 12a. Such a structure is advantageous in that it can save the manufacturing cost of the panel because it does not require the transparent electrodes 11a and 12a. The bus electrodes 11b and 12b used in the structure may also be formed using a variety of materials, such as a photosensitive material, other than the above-mentioned materials.

Black matrices (BM) 15 are arranged between the transparent electrodes 11a and 12a and the bus electrodes 11b and 12b of the scan electrode 11 and the sustain electrode 12. The black matrices 15 has a light-shielding function of reducing the reflection of external light generated outside the front substrate 10 by absorbing the external light and a function of improving the purity and contrast of the front substrate 10.

The black matrices 15 according to an embodiment of the present invention are formed in the front substrate 10. Each of the black matrices 15 may include a first black matrix 15 formed at a location at which it is overlapped with a barrier rib 21, and second black matrices 11c and 12c formed between the transparent electrodes 11a and 12a and the bus electrodes 11b and 12b. The first black matrix 15, and the second black matrices 11c and 12c, which are also referred to as a "black layer" or a "black electrode layer", may be formed at the same time and be connected physically, or may be formed separately and not be connected physically.

In the case where the first black matrix 15 and the second black matrices 11c and 12c are connected to each other physically, the first black matrix 15 and the second black matrices 11c and 12c may be formed using the same material. However, in the event that the first black matrix 15 and the second black matrices 11c and 12c are not connected to each other physically, the first black matrix 15 and the second black matrices 11c and 12c may be formed using different materials.

An upper dielectric layer 13 and a protection layer 14 are laminated on the front substrate 10 in which the scan electrodes 11 and the sustain electrodes 12 are formed in parallel. Charged particles generated by a discharge are accumulated on the upper dielectric layer 13. The upper dielectric layer 13 can serve to protect the sustain electrode pair 11 and 12. The protection layer 14 serves to protect the upper dielectric layer 13 from sputtering of charged particles generated during the discharge of a gas and also to increase emission efficiency of secondary electrons.

The address electrodes 22 are formed in such a way to cross the scan electrodes 11 and the sustain electrodes 12. Lower dielectric layers 24 and barrier ribs 21 are also formed on the rear substrate 20 in which the address electrodes 22 are formed.

A phosphor layer 23 is formed on the lower dielectric layers 24 and the surfaces of the barrier ribs 21. Each of the barrier ribs 21 includes a longitudinal barrier rib 21a and a traverse barrier rib 21b, which form a closed form. The barrier ribs 21 can separate discharge cells physically, and can also prevent ultraviolet rays generated by a discharge and a visible ray from leaking to neighboring discharge cells.

As shown in FIG. 1, it is preferred that a filter 100 be formed at the front of the PDP according to an embodiment of the present invention. The filter 100 may include an external light shielding sheet, an Anti-Reflection (AR) sheet, a Near Infrared (NIR) shielding sheet, an Electromagnetic Interference (EMI) shielding sheet, a diffusion sheet, an optical characteristic sheet, and so on.

The filter 100 can be attached to the front of the panel by means of an adhesive layer. When the adhesive layer has a thickness of 10 to 30 μm, it can effectively block externally incident light and can also effectively emit light generated from the panel to the outside. To protect the panel from pressures from the outside, etc., the adhesive layer may have a thickness of 30 to 120 μm.

The filter 100 may be attached to the panel in film form, and it may have a glass filter form in which an external light shielding sheet, an AR sheet, a NIR shielding sheet, an EMI shielding sheet, a diffusion sheet, an optical characteristic sheet or the like is attached to glass (i.e., a base material).

An embodiment of the present invention may be applied to not only the structure of the barrier ribs 21 shown in FIG. 1, but also the structure of barrier ribs having a variety of shapes. For example, an embodiment of the present invention may be applied to a differential type barrier rib structure in which the longitudinal barrier rib 21a and the traverse barrier rib 21b have different height, a channel type barrier rib structure in which a channel that can be used as an exhaust passage is formed in at least one of the longitudinal barrier rib 21a and the traverse barrier rib 21b, a hollow type barrier rib structure in which a hollow is formed in at least one of the longitudinal barrier rib 21a and the traverse barrier rib 21b.

In the differential type barrier rib structure, it is preferred that the traverse barrier rib 21b have a height "h" higher than that of the longitudinal barrier rib 21a. In the channel type barrier rib structure or the hollow type barrier rib structure, it is preferred that a channel or a hollow be formed in the traverse barrier rib 21b.

Meanwhile, in an embodiment of the present invention, it has been shown and described that the R, G, and B discharge cells are arranged on the same line. However, the R, G, and B discharge cells may be arranged in different forms. For example, the R, G, and B discharge cells may have a delta type arrangement in which they are arranged in a triangle. Furthermore, the discharge cells may be arranged in a variety of forms, such as square, pentagon and hexagon.

The phosphor layer is emitted with ultraviolet rays generated during the discharge of a gas to generate any one visible ray of red (R), green (G) and blue (B). Discharge spaces provided between the upper/rear substrates 10 and 20 and the barrier ribs 21 are injected with a mixed inert gas, such as He+Xe, Ne+Xe or He+Ne+Xe.

Figure 2:
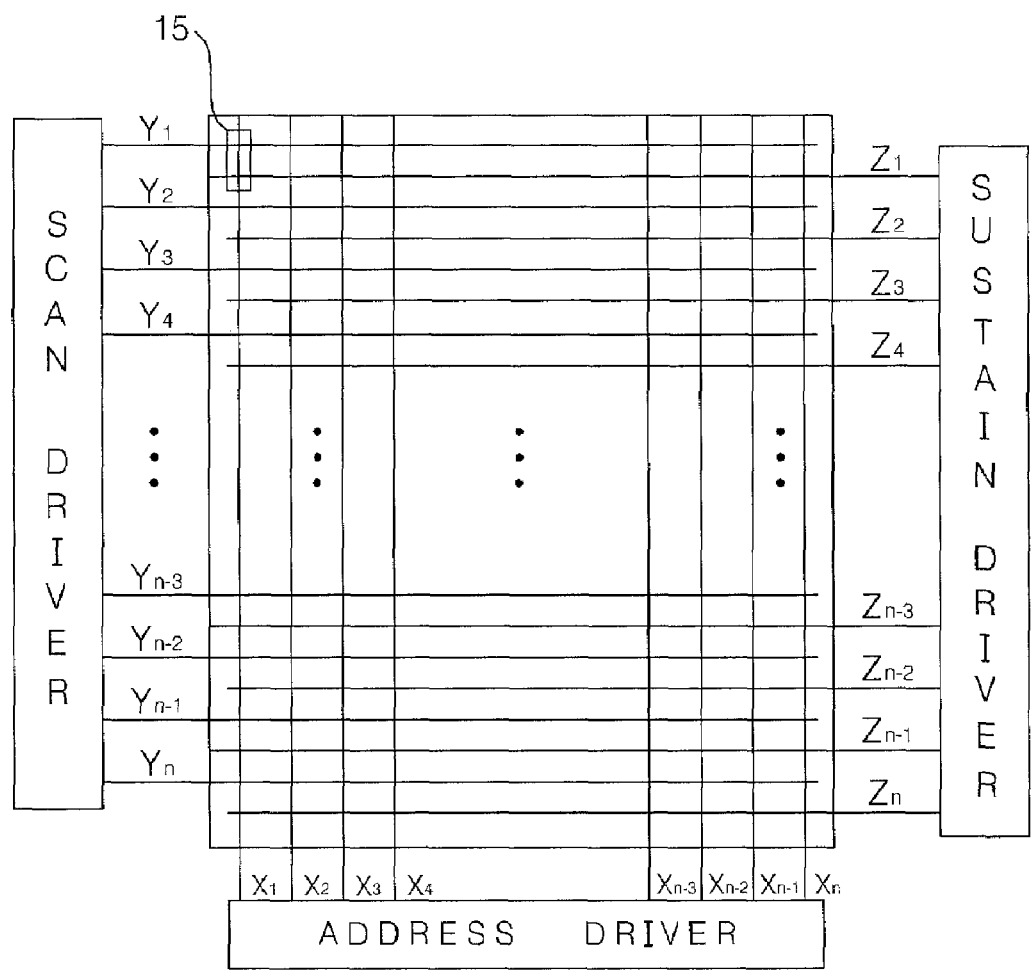
FIG. 2 is a view illustrating an embodiment of electrode arrangements of the PDP.

FIG. 2 is a view illustrating an embodiment of electrode arrangements of the PDP. It is preferred that a plurality of discharge cells constituting the PDP be arranged in matrix form, as illustrated in FIG. 2. The plurality of discharge cells are respectively disposed at the intersections of scan electrode lines Y1 to Ym, sustain electrodes lines Z1 to Zm, and address electrodes lines X1 to Xn. The scan electrode lines Y1 to Ym may be driven sequentially or simultaneously. The sustain electrode lines Z1 to Zm may be driven at the same time. The address electrode lines X1 to Xn may be driven with them being divided into even-numbered lines and odd-numbered lines, or may be driven sequentially.

The electrode arrangement shown in FIG. 2 is only an embodiment of the electrode arrangements of the PDP according to an embodiment of the present invention. Thus, the present invention is not limited to the electrode arrangements and the driving method of the PDP, as illustrated in FIG. 2. For example, the present invention may be applied to a dual scan method in which two of the scan electrode lines Y1 to Ym are driven at the same time. Furthermore, the address electrode lines X1 to Xn may be driven with them being divided into upper and lower parts on the basis of the center of the panel.

Figure 3:
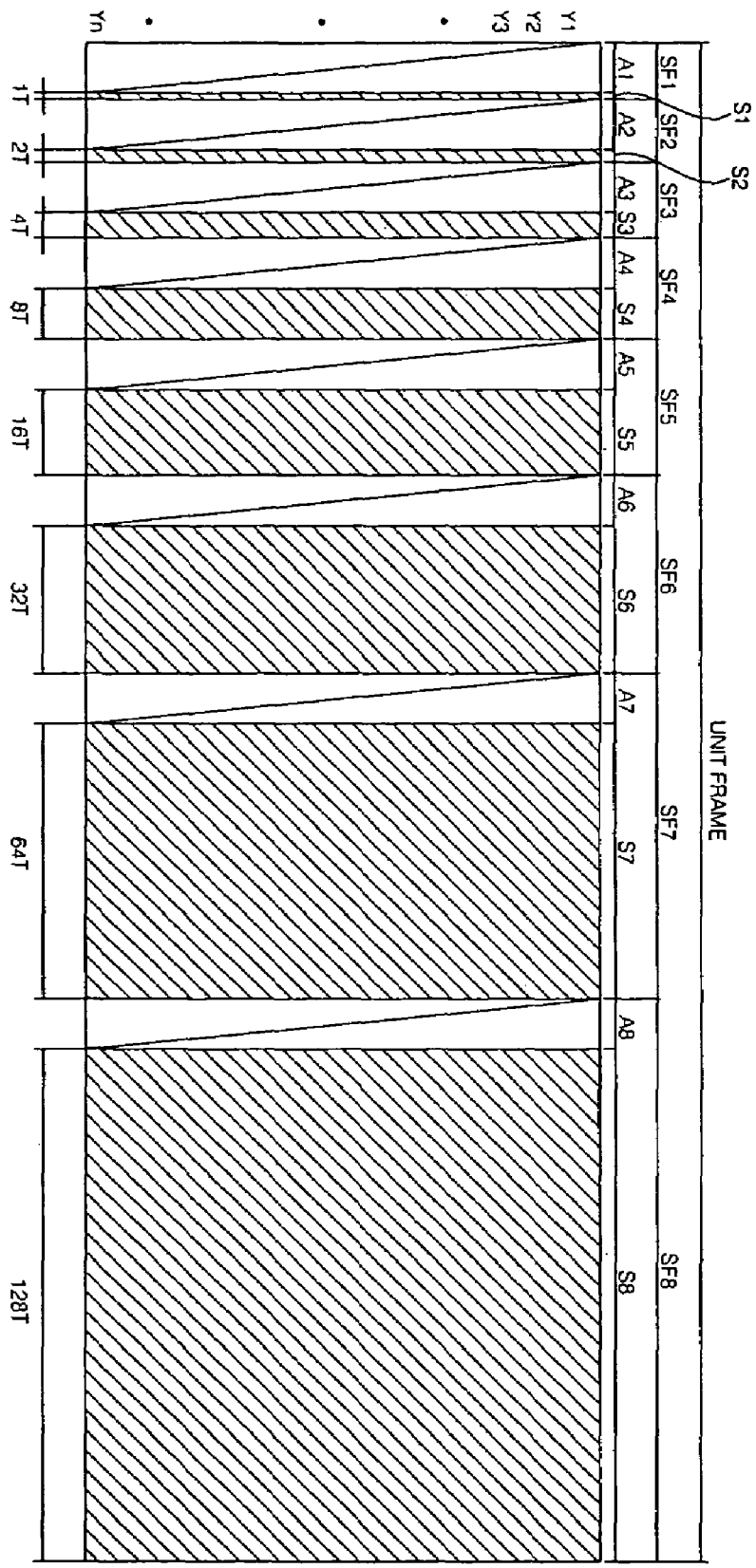
FIG. 3 is a timing diagram showing an embodiment of a method of driving a plasma display apparatus with one frame of an image being time-divided into a plurality of subfields.

FIG. 3 is a timing diagram showing an embodiment of a method of driving a plasma display apparatus with one frame of an image being time-divided into a plurality of subfields. A unit frame may be divided into a predetermined number (for example, eight subfields SF1, ..., SF8) in order to realize time-divided gray level display. Each of the subfields SF1, ..., SF8 is divided into a reset period (not shown), address periods A1, ..., A8, and sustain periods S1, ..., S8.

In accordance with an embodiment of the present invention, the reset period may be omitted from at least one of the plurality of subfields. For example, the reset period may exist only in the first subfield, or may exist only in a subfield approximately between the first subfield and the whole subfields.

In each of the address periods A1, ..., A8, an address signal is applied to address electrodes X, and scan signals corresponding to the respective scan electrodes Y are sequentially applied to the address electrodes X.

In each of the sustain periods S1, ..., S8, a sustain signal is alternately applied to the scan electrodes Y and a sustain electrodes Z. Accordingly, a sustain discharge is generated in discharge cells on which wall charges are formed in the address periods A1, ..., A8.

The luminance of the PDP is proportional to the number of sustain discharge pulses within the sustain periods S1, ..., S8 occupied in the unit frame. In the case where one frame forming 1 image is represented by eight subfields and 256 gray levels, a different number of sustain signals may be sequentially allocated to the respective subfields in the ratio of 1, 2, 4, 8, 16, 32, 64, and 128. For example, to obtain the luminance of 133 gray levels, a sustain discharge can be generated by addressing cells during the subfield1 period, the subfield3 period, and the subfield8 period.

The number of sustain discharges allocated to the respective subfields may be variably decided depending on the weights of subfields based on an Automatic Power Control (APC) step. That is, an example in which one frame is divided into eight subfields has been described with reference to FIG. 3. However, the present invention is not limited to the above example, but the number of subfields forming one frame may be varied depending on design specifications. For example, the PDP can be driven by dividing one frame into eight or more subfields, such as 12 or 16 subfields.

Furthermore, the number of sustain discharges allocated to each subfield may be changed in various ways by taking a gamma characteristic or a panel characteristic into consideration. For example, the degree of a gray level allocated to the subfield4 can be lowered from 8 to 6, and the degree of a gray level allocated to the subfield6 can be lowered from 32 to 34.

Figure 4:
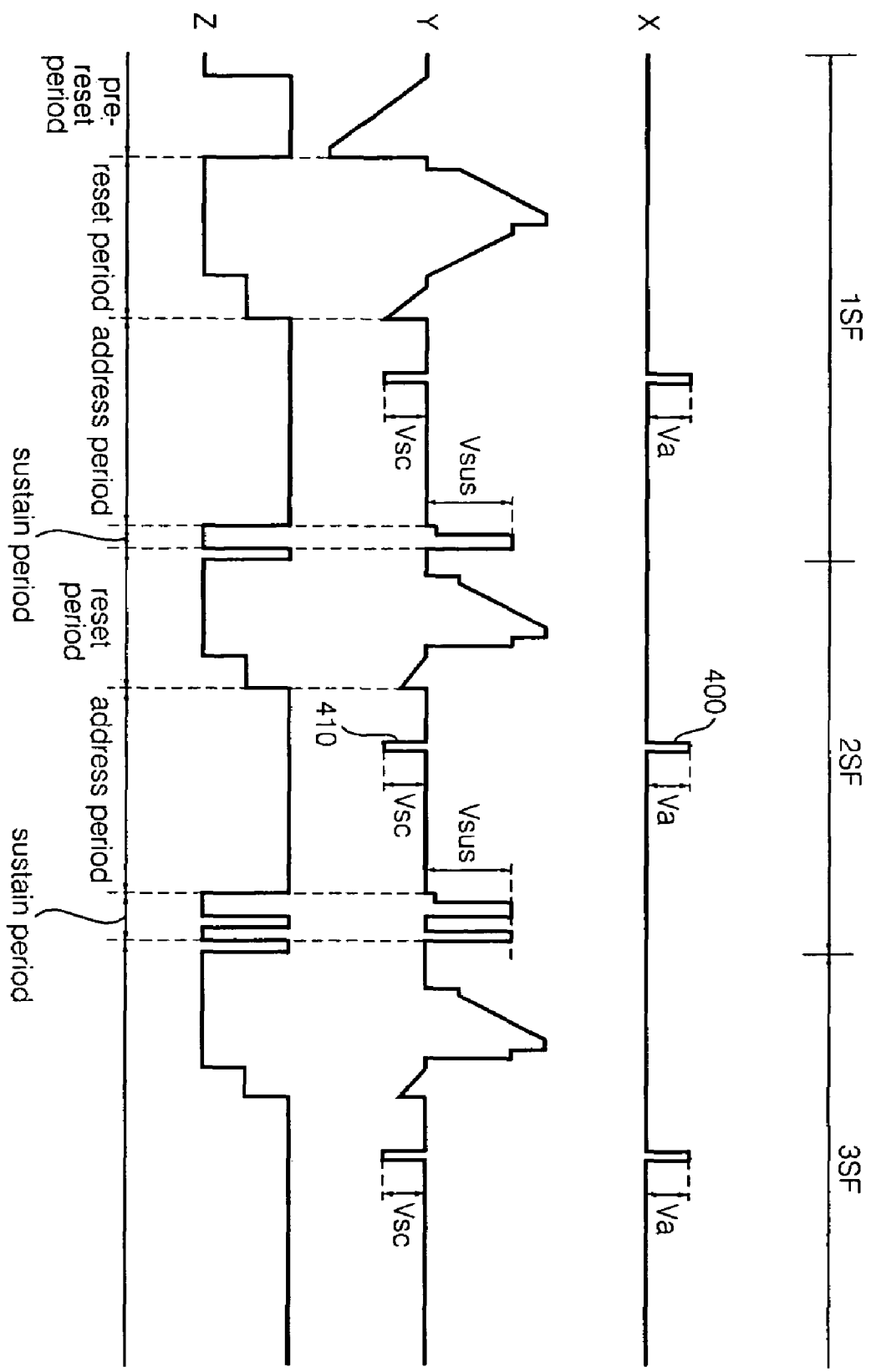
FIG. 4 is a timing diagram illustrating an embodiment of driving signals for driving the PDP.

FIG. 4 is a timing diagram illustrating an embodiment of driving signals for driving the PDP.

Each subfield includes a pre-reset period for forming positive wall charges on the scan electrodes Y and negative wall charges on the sustain electrodes Z, a reset period for initializing discharge cells of the whole screen by employing wall charge distributions formed by the pre-reset period, an address period for selecting discharge cells, and a sustain period for sustaining the discharge of selected discharge cells.

The reset period includes a setup period and a set-down period. In the setup period, a ramp-up waveform Ramp-up is applied to the entire scan electrodes at the same time. Thus, a minute discharge is generated in the entire discharge cells and wall charges are generated accordingly. In the set-down period, a ramp-down waveform Ramp-down, which falls from a positive voltage lower than a peak voltage of the ramp-up waveform, is applied to the entire scan electrodes Y at the same time. Accordingly, an erase discharge is generated in the entire discharge cells, thereby erasing unnecessary charges from the wall charges generated by the set-up discharge and spatial charges.

In the address period, a scan signal 410 having a negative scan voltage Vsc is sequentially applied to the scan electrodes Y, and an address signal 400 having a positive address voltage Va is applied to the address electrodes X so that the address signal 400 is overlapped with the scan signal. Therefore, an address discharge is generated due to a voltage difference between the scan signal 410 and the data signal 400 and a wall voltage generated during the reset period, so that cells are selected. Meanwhile, during the set-down period and the address period, a signal to sustain a sustain voltage is applied to the sustain electrodes Z.

In the sustain period, a sustain signal is alternately applied to the scan electrodes Y and the sustain electrodes Z. Accordingly, a sustain discharge occurs between the scan electrodes and the sustain electrodes in a surface discharge fashion.

The driving waveforms illustrated in FIG. 4 correspond a first embodiment of signals for driving the PDP according to an embodiment of the present invention. The present invention is not limited to the waveforms illustrated in FIG. 4. For example, the pre-reset period may be omitted, the polarities and voltage levels of the driving signals illustrated in FIG. 4 may be changed, if needed, and an erase signal for erasing wall charges may be applied to the sustain electrodes after the sustain discharge is completed. The present invention may also be applied to a single sustain driving method in which the sustain signal is applied to either the scan electrodes Y or the sustain electrodes Z, thus generating a sustain discharge.

Figure 5:
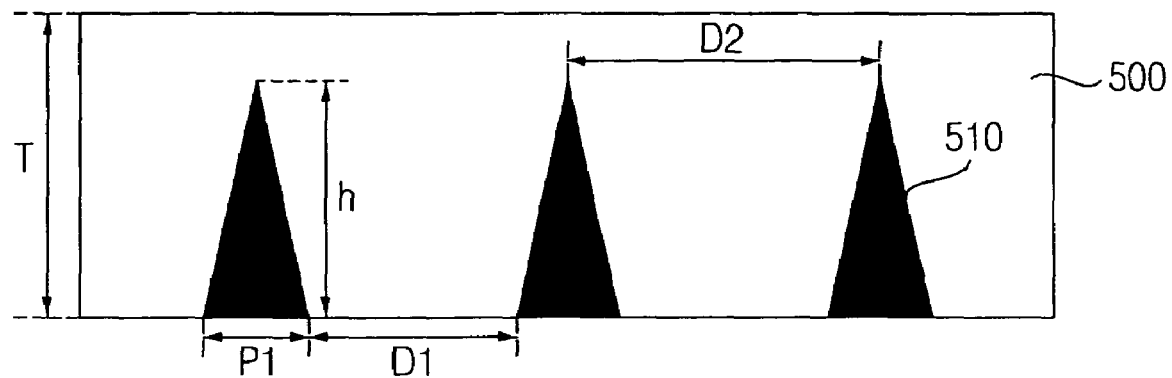
FIGS. 5 to 11 are cross-sectional views illustrating embodiments of a sectional structure of an external light shielding sheet according to an embodiment of the present invention.

FIGS. 5 to 10 are cross-sectional views illustrating embodiments of a sectional structure of an external light shielding sheet according to an embodiment of the present invention. As illustrated in FIG. 5, the external light shielding sheet includes a base unit 500 and pattern units 510.

In FIG. 5, the bottom of the external light shielding sheet is on a panel side, and the top of the external light shielding sheet is on a user side on which external light is incident. An external light source is generally disposed on the upper side of the panel, and therefore external light can be incident from the upper side to the panel at a tilt angle.

To block the external light through absorption and to increase the reflectance of panel light by totally reflecting a visible ray emitted from the panel, the reflective index of each pattern unit 510, that is, the reflective index of an inclined surface (i.e., at least a part of the pattern unit 510) is preferably lower than that of the base unit 500.

External light that degrades the bright and dark room contrast of the panel usually exists over the head of a viewer.

Referring to FIG. 5, external light incident on the external light shielding sheet at a tilt angle according to Snell's law is refracted into the pattern units 510 having a reflective index lower than that of the base unit 500 and is thus absorbed. The external light refracted into the pattern units 310 can be absorbed by optical absorbing particles.

For the purpose of display, light emitted from the panel to the outside, it is totally reflected from the inclined surface of the pattern units 510 and is reflected toward the outside (i.e., toward the viewer side).

The reason why the external light is refracted and absorbed by the pattern unit 510, and light emitted from the panel 520 is totally reflected from the pattern unit 510, as described above, is that an angle in which the external light and the inclined surface of the pattern unit 510 form is greater than an angle in which the panel light and the inclined surface of the pattern unit 510 form.

Therefore, the external light shielding sheet according to an embodiment of the present invention absorbs external light so that the external light is reflected toward the viewer side, and increases the amount of reflection of light emitted from the panel. It is therefore possible to improve the bright and dark room contrast of a display image.

In order to maximize the absorption of external light and total reflection of the panel light considering the angle of the external light incident on the panel, it is preferred that the reflective index of the pattern unit 510 be in the range of 0.3 to 0.999 times that of the base unit 500. To maximize total reflection of light emitted from the panel from the inclined surface of the pattern unit 510, it is preferred that the reflective index of the pattern unit 510 range from 0.3 to 0.8 times that of the base unit 500 considering upper and lower viewing angles of the PDP.

The base unit 500 may be preferably formed of a transparent plastic material through which light can transmit smoothly, that is, a resin-based material formed by an UV-hardening method. To further protect the front of the panel, the base unit 500 may be formed using a robust glass material.

Referring to FIG. 5, the pattern units 510 may be a triangle, and may also have a variety of shapes. The pattern units 510 is formed using a material darker than that of the base unit 500, and may be preferably made of a dark material. For example, the pattern units 510 may be formed of a carbon-based material, or may be coated with dark dyes in order to maximize the absorption of external light.

The pattern units 510 may include optical absorbing particles. The optical absorbing particles may be resin particles colored with a specific color. To maximize the optical absorption effect, it is preferred that the optical absorbing particles be colored with a dark color.

In order to facilitate the fabrication of the optical absorbing particles and the addition of the optical absorbing particles to the pattern units 510 and to maximize the absorption of external light, the optical absorbing particles may have 1 μm or more in size. If the size of the optical absorbing particles is 1 μm or more, the pattern units 510 may include optical absorbing particles of 10 weight % or more in order to effectively absorb external light refracted into the pattern units 510. That is, optical absorbing particles of 10 weight % or more, of a total weight of the pattern units 510, may be included in he pattern units 210.

When the external light shielding sheet has a thickness T of 20 to 250 μm, a manufacturing process is convenient and an adequate optical transmittance can be obtained. The thickness T of the external light shielding sheet may be set in the range of 100 to 180 μm so that light emitted from the panel smoothly transmits through the external light shielding sheet, externally incident light is refracted and effectively absorbed and blocked by the pattern units 510, and the robustness of the sheet can be obtained.

Referring to FIG. 5, the pattern units 510 formed on the base unit 500 may have a triangle, more preferably, an isosceles triangle. The pattern unit 510 may have a bottom width P1 of 18 to 35 μm. In this case, the aperture ratio for allowing light generated from the panel to be smoothly radiated to a user side can be secured, and external light shielding efficiency can be maximized.

The pattern units 510 may have a height "h" of 80 to 170 μm. It is thus possible to form an inclined surface gradient capable of effectively absorbing external light and effectively reflecting the panel light in the relationship with the bottom width P1, and also to prevent the short of the pattern units 510.

In order to secure the aperture ratio for displaying a display image with an adequate luminance as the panel light is radiated to the user side and to secure an optimal inclined surface gradient of the pattern units 510 for improving external light shielding effect and panel light reflection efficiency, a distance D1 between two neighboring pattern units may be set in the range of 40 to 90 μm, and a distance D2 between top ends of two neighboring pattern units may range from 60 to 130 μm.

For the above reasons, when the distance D1 between two neighboring pattern units is 1.1 to 5 times the bottom width of the pattern unit 510, the aperture ratio for display can be secured. In order to optimize external light shielding effect and panel light reflection efficiency while securing the aperture ratio, the distance D1 between two neighboring pattern units may be set in the range of 1.5 to 3.5 times the bottom width of the pattern unit 510.

When the height "h" of the pattern unit 510 is 0.89 to 4.25 times the distance D1 between two neighboring pattern units, external light incident from the upper side a tilt angle may not be incident to the panel. Furthermore, in order to prevent the short of the pattern units 510 and optimize reflection efficiency of the panel light, the height "h" of the pattern unit 510 may be set in the range of 1.5 to 3 times the distance D1 between two neighboring pattern units.

When the distance D2 between the top ends of the two neighboring pattern units is 1 to 3.25 times the distance D1 between bottom ends of the two neighboring pattern units, the aperture ratio for displaying an image having an adequate luminance can be secured. In order to optimize reflection efficiency in which the panel light is totally reflected from the inclined surface of the pattern units 510, the distance D2 between the top ends of the two neighboring pattern units can be set in the range of 1.2 to 2.5 times the distance D1 between the bottom ends of the two neighboring pattern units.

Figure 6:
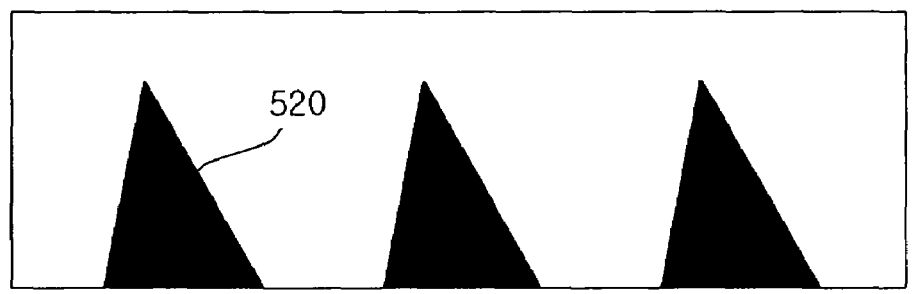

Referring to FIG. 6, the pattern unit 520 may be symmetrical to each other right and left. In other words, the pattern unit 520 may have different right and left inclined surface areas. Furthermore, an angle in which the right inclined surface and the bottom form may be different from an angle in which the left inclined surface and the bottom form.

In general, since objects generating external light are located over the panel, the external light is incident from the upper side of the panel to the panel within a given angle range. Thus, in order to increase an external light absorption effect and increase the reflectance of light emitted from the panel, the gradient of an upper-side inclined surface on which the external light is incident, of the two inclined surfaces of the pattern unit 510, may be gentler than that of a lower-side inclined surface of the two inclined surfaces of the pattern unit 510. That is, the gradient of the upper-side inclined surface of the two inclined surfaces of the pattern unit 510 may be set smaller than that of the lower-side inclined surface the two inclined surfaces of the pattern unit 510.

Figure 7:
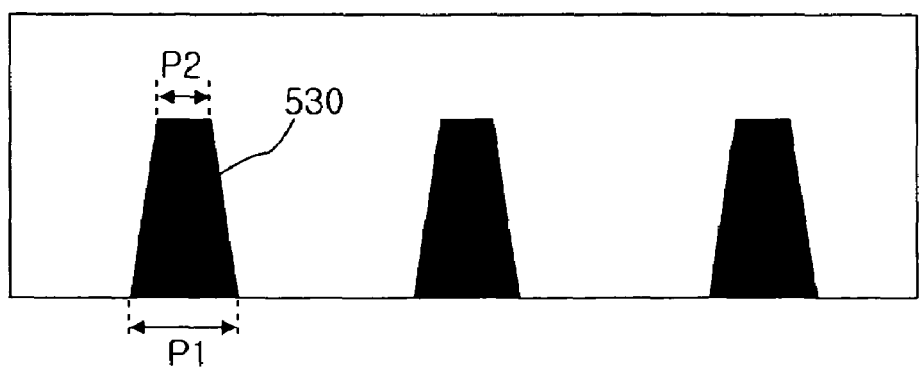

Referring to FIG. 7, each of the pattern units 530 may have a trapezoid. In this case, a width P2 of a top end of each pattern unit 530 is smaller than a width P1 of a bottom end of the pattern unit 530. The width P2 of the top end of the pattern unit 530 may be set in the range of 10 μm or less. Accordingly, in the relationship with the bottom width P1, an inclined surface gradient, which enables the external light to be absorbed effectively and the panel light to be reflected effectively, can be formed.

Figure 8:
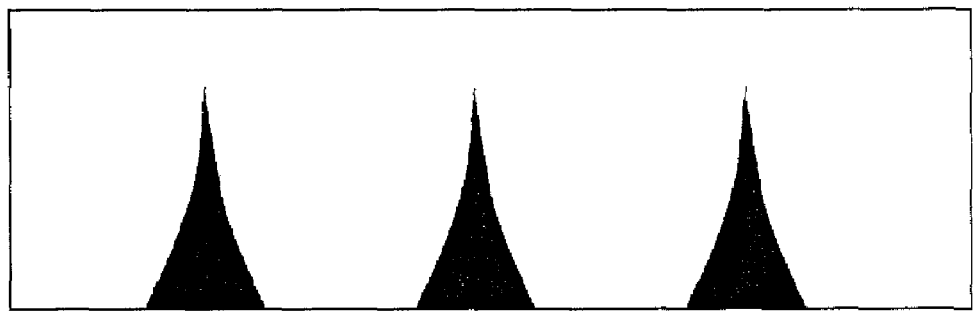
Figure 9:
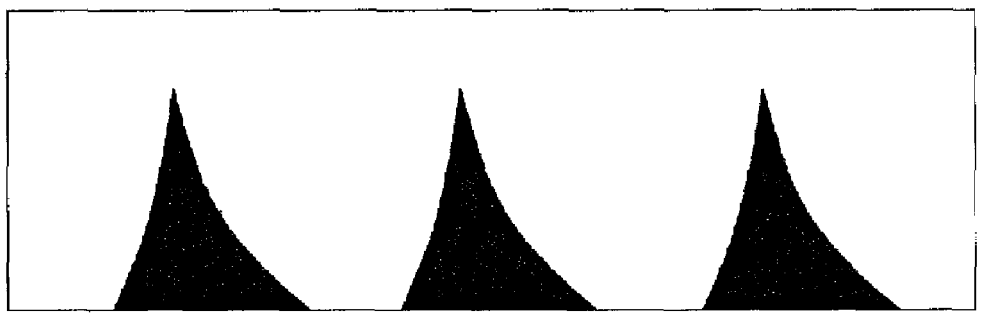
Figure 10:
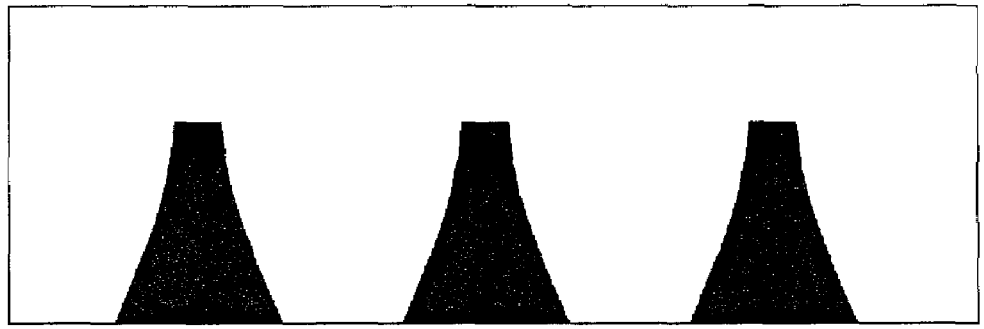

As illustrated in FIGS. 8 to 10, the pattern units shown in FIGS. 5 to 7 may have curved right and left inclined surfaces, and may have curved top or bottom ends of the pattern.

In the embodiments of the sectional shape of the pattern unit illustrated in FIGS. 5 to 10, the edge portions of the pattern unit may have a curved shape having a given curvature, and the edge portions of the bottom end of the pattern unit may have a curved shape extending externally.

Figure 11:
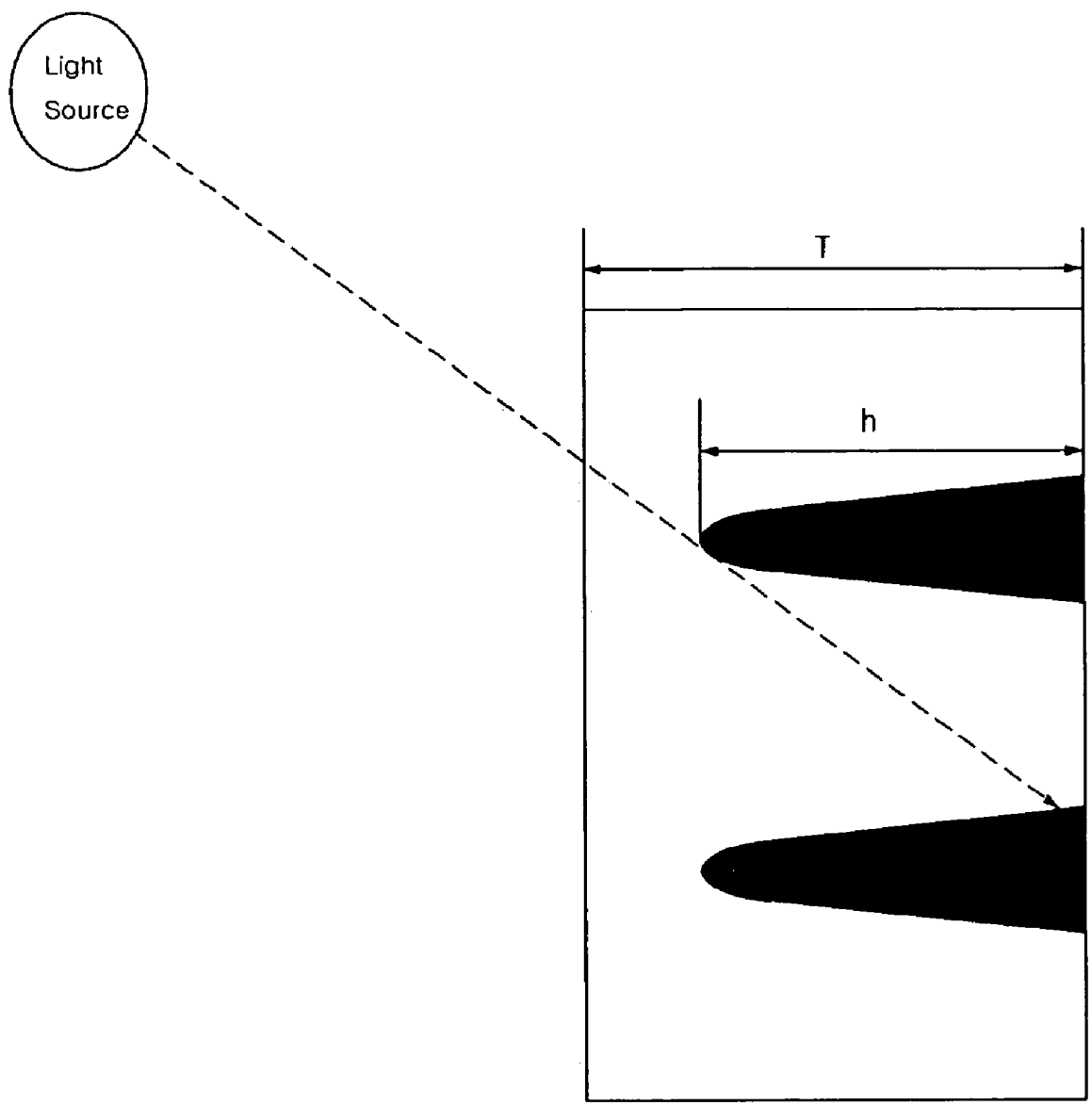

FIG. 11 is a cross-sectional view illustrating an embodiment of the structure of the external light shielding sheet according to an embodiment of the present invention in order to describe the thickness of the external light shielding sheet and the height of the pattern units.

Referring to FIG. 11, in order to secure the roughness of the external light shielding sheet including the pattern units and also to secure transmittance of a visible ray emitted from the panel so as to display an image, it is preferred that the external light shielding sheet have a thickness T of 100 μm to 180 μm.

When the height "h" of each of the pattern units including in the external light shielding sheet is 80 to 170 μm, the fabrication of the pattern units is the most convenient, the external light shielding sheet can have an adequate aperture ratio, and an external light shielding effect and a reflection effect of light emitted from the panel can be maximized.

The height "h" of the pattern unit may be varied depending on the thickness T of the external light shielding sheet. In general, external light, being incident on the panel to affect a lowering in the bright and dark room contrast, is mainly located at a location higher than the panel. Thus, in order to effectively block the incident external light, it is preferred that the height "h" of the pattern unit have a given value range with respect to the thickness T of the external light shielding sheet.

Referring to FIG. 11, as the height "h" of the pattern unit increases, the thickness of the base unit at the top portion of the pattern unit becomes thin, resulting in insulating breakdown. As the height "h" of the pattern unit decreases, external light having a given angle range is incident on the panel, thus hindering proper shielding of the external light.

The following Table 1 is an experimental result on insulating breakdown and external light shielding effect of the external light shielding sheet depending on the thickness T of the external light shielding sheet and the height "h" of the pattern unit.

TABLE 1

| Sheet Thickness (T) | Pattern Unit Height | Insulating Breakdown | External Light shielding |
|---|---|---|---|
| 120 μm | 120 μm | ○ | ○ |
| 120 μm | 115 μm | Δ | ○ |
| 120 μm | 110 μm | X | ○ |
| 120 μm | 105 μm | X | ○ |
| 120 μm | 100 μm | X | ○ |
| 120 μm | 95 μm | X | ○ |
| 120 μm | 90 μm | X | ○ |
| 120 μm | 85 μm | X | Δ |

TABLE 1-continued

| Sheet Thickness (T) | Pattern Unit Height | Insulating Breakdown | External Light shielding |
|---|---|---|---|
| 120 μm | 80 μm | X | Δ |
| 120 μm | 75 μm | X | Δ |
| 120 μm | 70 μm | X | Δ |
| 120 μm | 65 μm | X | Δ |
| 120 μm | 60 μm | X | Δ |
| 120 μm | 55 μm | X | Δ |
| 120 μm | 50 μm | X | X |

Referring to Table 1, when the thickness T of the external light shielding sheet is 120 μm, if the height "h" of the pattern unit is set to 115 μm or more, the failure rate of a product may increase since there is a danger that the pattern unit may experience insulating breakdown. If the height "h" of the pattern unit is set to 115 μm or less, the failure rate of the external light shielding sheet may decrease since there is no danger that the pattern unit may experience insulating breakdown. However, when the height of the pattern unit is set to 85 μm or less, an efficiency in which external light is blocked by the pattern unit may decrease. When the height of the pattern unit is set to 60 μm or less, external light can be incident on the panel.

When the thickness T of the external light shielding sheet is 1.01 to 2.25 times the height "h" of the pattern unit, insulating breakdown at the top portion of the pattern unit can be prevented, and external light can be prevented from being incident on the panel.

In order to increase the amount of reflection of light emitted from the panel and to second a viewing angle while preventing insulating breakdown and external light from being incident on the panel, the thickness T of the external light shielding sheet may be in the range of 1.01 to 1.5 times the height "h" of the pattern unit.

Figure 12:
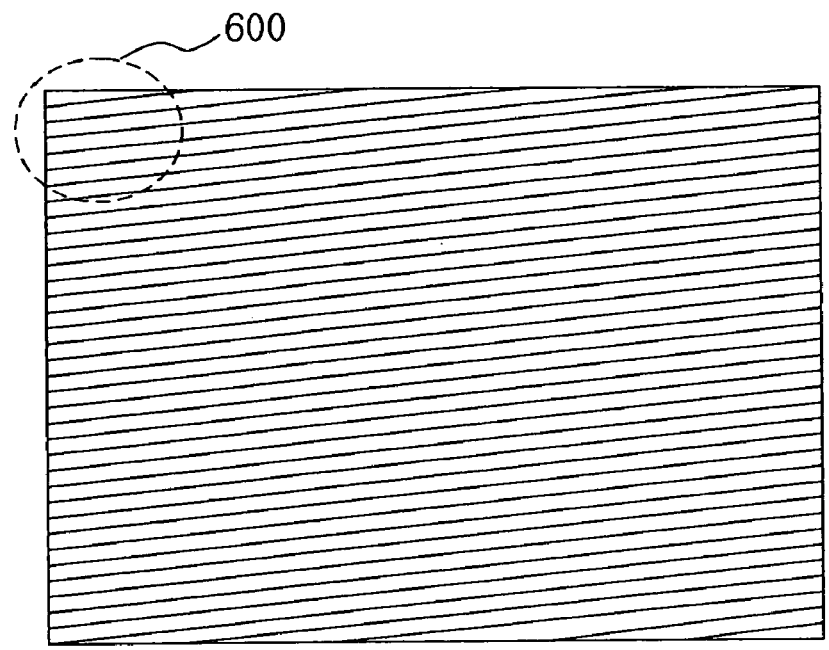
FIGS. 12 and 13 are views illustrating an embodiment of a pattern units formed in the external light shielding sheet according to an embodiment of the present invention.
Figure 13:
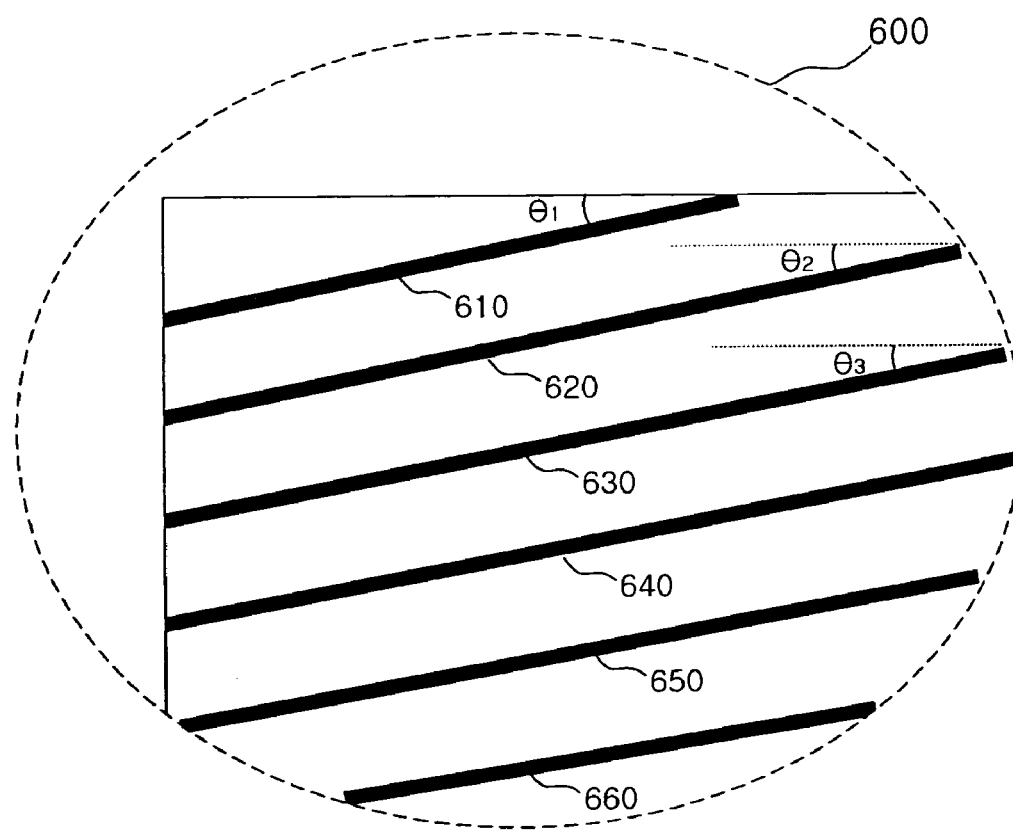

FIGS. 12 and 13 are views illustrating embodiments of the pattern units formed in the external light shielding sheet according to the present invention.

It is preferred that the pattern units be formed on the base unit in a row at given intervals, as illustrated in FIGS. 12 and 13. The pattern units are formed at a tilt angle from the top end or bottom end of the external light shielding sheet.

By forming the pattern units at a tilt angle as illustrated in FIG. 12, the Moire phenomenon incurred by the black matrix, the black layer, etc. within the panel can be prevented. The Moire phenomenon refers to patterns of a low frequency, which occur as patterns of a similar lattice shape are overlapped. For example, the Moire phenomenon may refer to wave patterns appearing when mosquito nets are overlapped. The Moire phenomenon inevitably occurs in the PDP because the PDP has the lattice structure. The Moire phenomenon can be reduced by the shape of the pattern units, as illustrated in FIGS. 12 and 13.

An angle formed by the pattern units, formed on the base unit in a line, and the top end of the external light shielding sheet ranges from 0.5 to 9 degrees. The Moire phenomenon ca be prevented since the pattern units are inclined at the above angle. Taking the fact that external light incident on the panel usually exists over the head of a user into consideration, when the angle formed by the pattern units and the top end of the external light shielding sheet ranges from 0.5 to 4.5 degrees, the Moire phenomenon can be prevented and the external light can be blocked most effectively.

FIG. 13 is an enlarged view showing a portion 600 of the external light shielding sheet shown in FIG. 12. It is preferred that pattern units 610, 620, 630, 640, 650 and 660 formed in a row be parallel to each other. Even when they are not parallel to each other, it is preferable that angles formed by the pattern units 610, 620, 630, 640, 650 and 660, and the top end of the external light shielding sheet have the above range. For example, the angles $\theta_1$, $\theta_2$ and $\theta_3$ formed by the pattern units 610, 620 and 630, and the top end of the external light shielding sheet may quite differ from each other.

There have been shown, in FIGS. 12 and 13, that the pattern units are inclined from the right bottom of the external light shielding sheet to the left top of the external light shielding sheet. In an alternative embodiment, the pattern units may be inclined from the left top of the external light shielding sheet to the right bottom of the external light shielding sheet at the above angle.

Figure 14:
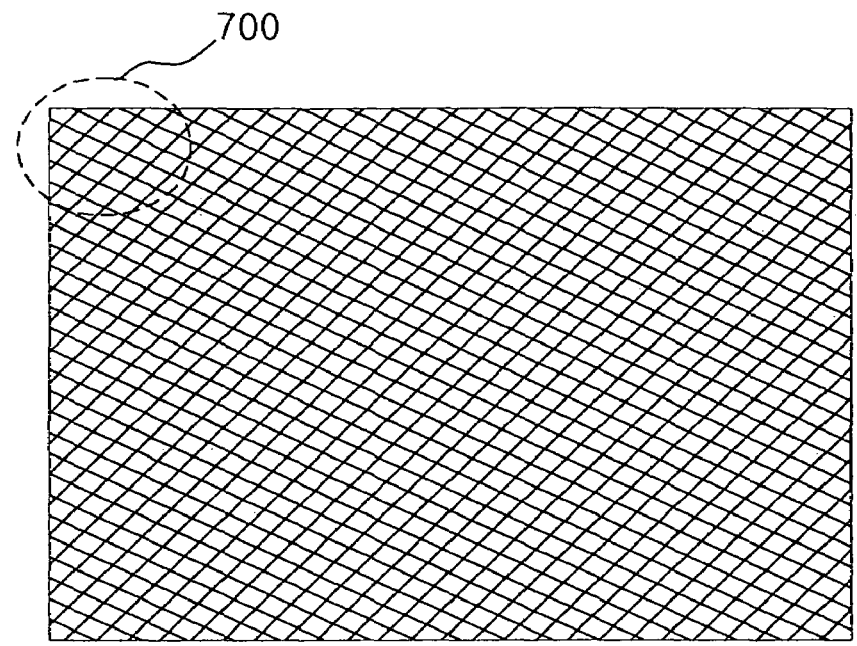
FIGS. 14 and 15 are views illustrating an embodiment of an EMI shielding layer.
Figure 15:
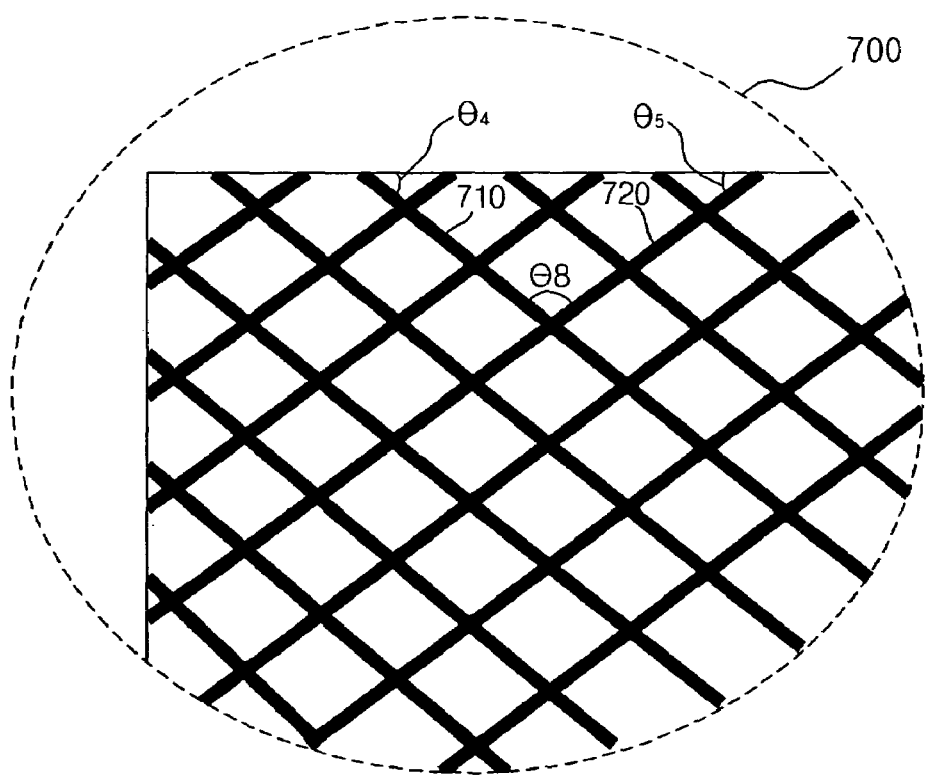

FIGS. 14 and 15 are views illustrating an embodiment of the EMI shielding layer. The EMI shielding layer preferably includes patterns made of Cu, etc. on the base unit, which are formed in mesh form.

FIG. 15 is an enlarged view of a portion 700 of the EMI shielding layer shown in FIG. 14. First mesh patterns 720 formed from a right top direction to a left bottom direction, and second mesh patterns 710 formed from a left top direction to a right bottom direction are formed in the EMI shielding layer so that they cross each other.

The first mesh patterns 720 form an angle $\theta_5$ together with the top end of the EMI shielding layer, and the second mesh patterns 710 form an angle $\theta_4$ together with the top end of the EMI shielding layer. The first mesh patterns 720 and the second mesh patterns 710 cross each other with a dihedral angle of $\theta_8$.

It is preferred that the patterns 710 and 720 formed in the EMI shielding layer have a width of 5 to 15 μm. When the patterns 710 and 720 have the above value range, the patterns according to the present invention are attached to the external light shielding sheet formed with inclination. Therefore, the Moire phenomenon can be effectively prevented, an EMI shielding effect can be obtained, a sufficient aperture ratio of the plasma display apparatus can be secured, and an adequate luminance of a display image can be sustained.

It is preferred that the EMI shielding layer, as illustrated in FIGS. 14 and 15, be overlapped with the external light shielding sheet included in the plasma display apparatus according to the present invention and attached thereto. The structure of the external light shielding sheet to which the EMI shielding layer is attached will be described in detail later on with reference to FIGS. 16 and 17.

In order for the first mesh patterns 720 and the second mesh patterns 710 to be attached to the external light shielding sheet according to the present invention, and to have the EMI shielding effect and also to reduce the Moire phenomenon, it is preferred that the angles $\theta_5$ and $\theta_4$ formed by the first mesh patterns 720 and the second mesh patterns 710, and the tope end of the EMI shielding layer form, respectively, range from 20 to 60 degrees. In this case, the dihedral angle $\theta_8$ of the first mesh patterns 720 and the second mesh patterns 710 may range from 60 to 130 degrees or 45 to 55 degrees.

In order to remove the Moire phenomenon by means of the patterns formed in the external light shielding sheet with inclination, it is preferred that the angles $\theta_5$ and $\theta_4$ formed by the first mesh patterns 720 and the second mesh patterns 710, and the tope end of the EMI shielding layer, respectively, range from 30 to 55 degrees. In this case, the dihedral angle $\theta_8$ of the first mesh patterns 720 and the second mesh patterns 710 may range from 70 to 118 degrees.

When the angles $\theta_5$ and $\theta_4$ formed by the first mesh patterns 720 and the second mesh patterns 710, and the tope end of the EMI shielding layer, respectively, range from 35 to 45 degrees, crossing patterns can be easily formed, and an adequate aperture ratio of the plasma display apparatus can be secured.

Figure 16:
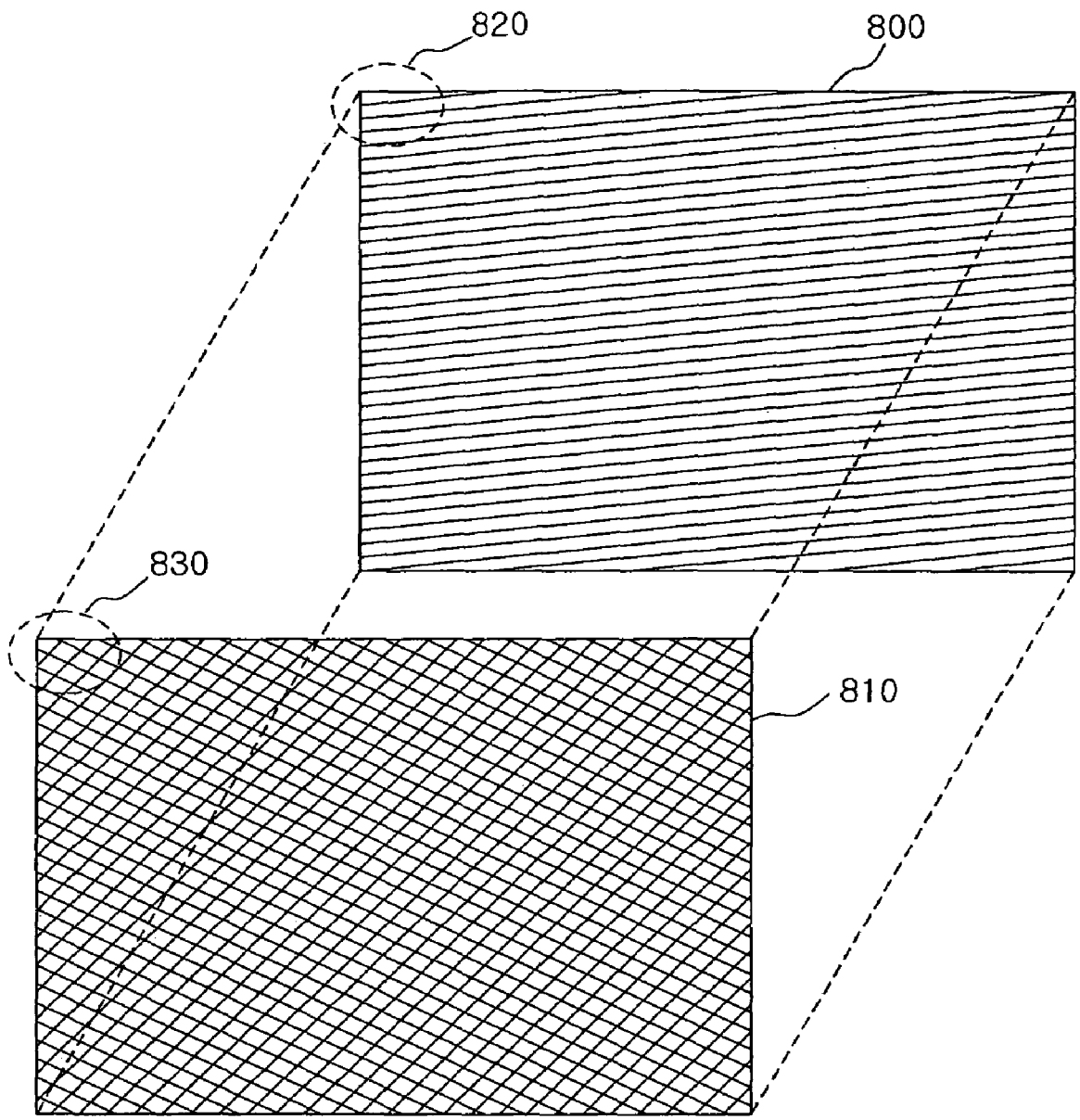
FIGS. 16 and 17 are views illustrating an embodiment of an external light shielding sheet to which the EMI shielding layer according to an embodiment of the present invention is attached.
Figure 17:
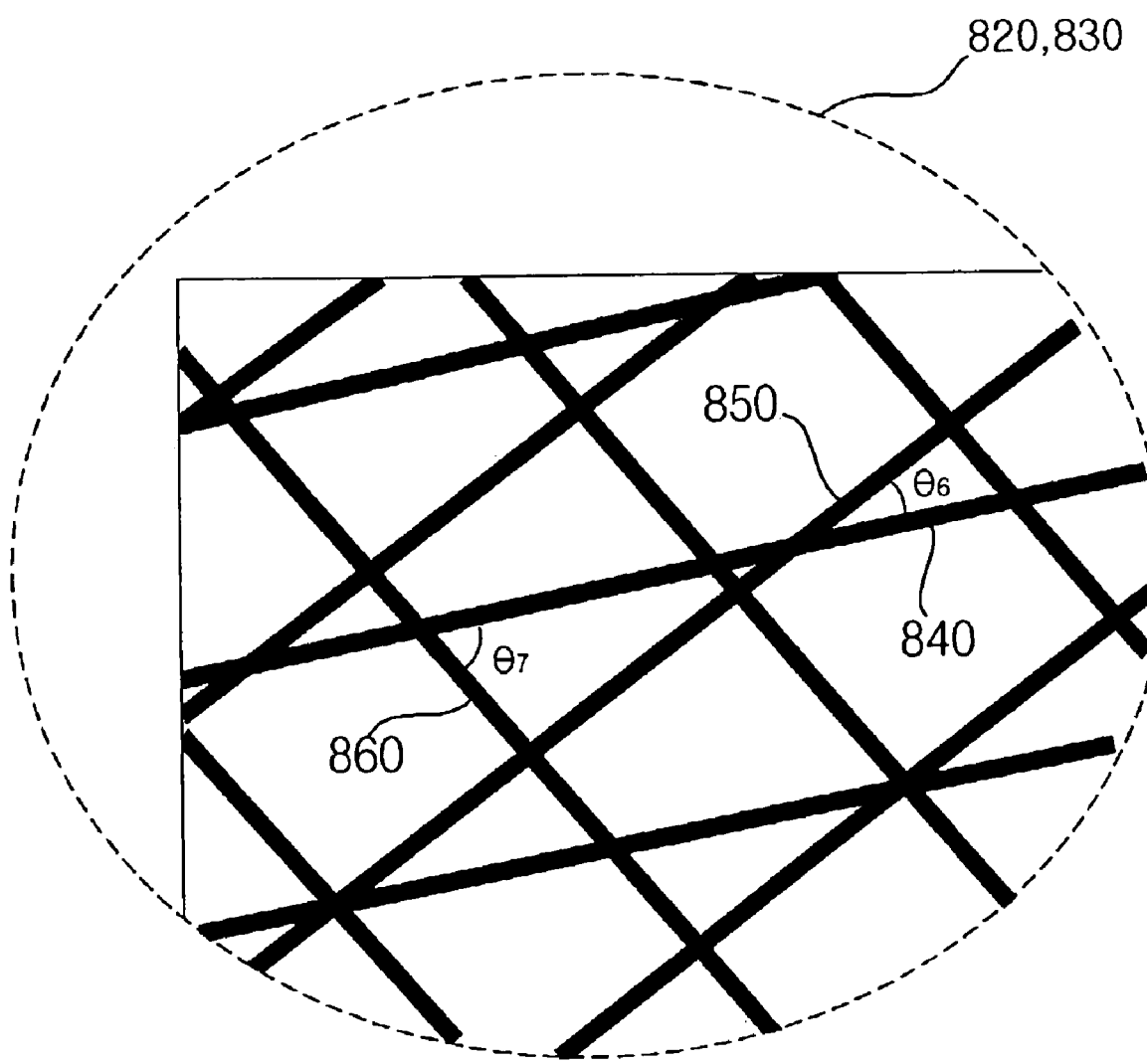

FIGS. 16 and 17 are views illustrating an embodiment of an external light shielding sheet to which the EMI shielding layer according to an embodiment of the present invention is attached. As illustrated in FIGS. 16 and 17, an EMI shielding layer 810 as illustrated in FIG. 14 is attached to an external light shielding sheet 800 in which pattern units are formed with inclination in order to prevent the Moire phenomenon according to the present invention.

FIG. 17 is an enlarged view of portions 820 and 830 of the external light shielding sheet to which the EMI shielding layer is attached as illustrated in FIG. 16 according to an embodiment of the present invention. Patterns 840 of the external light shielding sheet, and first and second mesh patterns 850 and 860 of the EMI shielding layer are overlapped with each other, as illustrated in FIG. 17.

When a dihedral angle $\theta_6$ formed by the patterns 840 of the external light shielding sheet and the first mesh patterns 850 of the EMI shielding layer ranges from 20 to 60 degrees, the external light shielding sheet to which the EMI shielding layer is attached can have an EMI shielding effect and can also reduce the Moire phenomenon.

In order for the external light shielding sheet to shield external light incident from the top end of the panel and to effectively prevent the Moire phenomenon, it is preferred that the dihedral angle $\theta_6$ formed by the patterns 840 of the external light shielding sheet and the first mesh patterns 850 of the EMI shielding layer range from 27 to 53 degrees. Furthermore, in order to accomplish the easiness of pattern formation and to secure an adequate aperture ratio and viewing angle of the plasma display apparatus, it is preferable that the dihedral angle $\theta_6$ formed by the patterns 840 of the external light shielding sheet and the first mesh patterns 850 of the EMI shielding layer be set in the range of 40 to 50 degrees.

In the case where the dihedral angle $\theta_7$ formed by the patterns 840 of the external light shielding sheet and the second mesh patterns 860 of the EMI shielding layer ranges from 28 to 65 degrees, external light shielding sheet to which the EMI shielding layer is attached can have the EMI shielding effect and also reduce the Moire phenomenon.

In order for the external light shielding sheet to shield external light incident on the top end of the panel and to effectively prevent the Moire phenomenon, it is preferred that the dihedral angle $\theta_7$ formed by the patterns 840 of the external light shielding sheet and the second mesh patterns 860 of the EMI shielding layer be set in the range of 33 to 58 degrees. In order to accomplish the easiness of pattern formation and to secure an adequate aperture ratio and viewing angle of the plasma display apparatus, it is preferable that the dihedral angle $\theta_7$ formed by the patterns 840 of the external light shielding sheet and the second mesh patterns 860 of the EMI shielding layer be set in the range of 40 to 50 degrees.

The following Table 2 is an experimental result on whether the Moire phenomenon has occurred depending on the angles formed by the patterns 840 of the external light shielding sheet and the first and second mesh patterns 850 and 860 of the EMI shielding layer. In this case, the angle $\theta_1$ formed by the patterns 840 of the external light shielding sheet and the tope end of the external light shielding sheet was fixed to an optimal value (i.e., 2.5 degrees) and the angle in which the first and second mesh patterns 850 and 860 of the EMI shielding layer are formed was controlled.

In the following Table 2, "○" denotes that the Moire phenomenon occurred, "Δ" denotes that the Moire phenomenon was reduced to 50% or less, and "×" denotes that the Moire phenomenon was not generated.

TABLE 2

| $\theta_1$ | $\theta_5$ | $\theta_4$ | Moire | $\theta_6$ | $\theta_5$ | $\theta_7$ |
|---|---|---|---|---|---|---|
| 2.5 | 5 | 5 | ○ | 170 | 2.5 | 7.5 |
| 2.5 | 5 | 7.5 | ○ | 167.5 | 2.5 | 10 |
| 2.5 | 10 | 10 | ○ | 160 | 7.5 | 12.5 |
| 2.5 | 10 | 12.5 | ○ | 157.5 | 7.5 | 15 |
| 2.5 | 15 | 15 | ○ | 150 | 12.5 | 17.5 |
| 2.5 | 15 | 17.5 | ○ | 147.5 | 12.5 | 20 |
| 2.5 | 20 | 20 | ○ | 140 | 17.5 | 22.5 |
| 2.5 | 20 | 22.5 | ○ | 137.5 | 17.5 | 25 |
| 2.5 | 25 | 25 | ○ | 130 | 22.5 | 27.5 |
| 2.5 | 25 | 27.5 | Δ | 127.5 | 22.5 | 30 |
| 2.6 | 30 | 30 | Δ | 120 | 27.5 | 32.5 |
| 2.6 | 30 | 32.5 | × | 117.5 | 27.5 | 35 |
| 2.5 | 35 | 35 | × | 110 | 32.5 | 37.5 |
| 2.5 | 35 | 37.5 | × | 107.5 | 32.5 | 40 |
| 2.5 | 40 | 40 | × | 100 | 37.5 | 42.5 |
| 2.5 | 40 | 42.5 | × | 97.5 | 37.5 | 45 |
| 2.5 | 45 | 45 | × | 90 | 42.5 | 47.5 |
| 2.5 | 45 | 47.5 | × | 87.5 | 42.5 | 50 |
| 2.5 | 50 | 50 | × | 80 | 47.5 | 52.5 |
| 2.5 | 50 | 52.5 | × | 77.5 | 47.5 | 55 |
| 2.5 | 55 | 55 | × | 70 | 52.5 | 57.5 |
| 2.5 | 55 | 57.5 | Δ | 67.5 | 52.5 | 60 |
| 2.5 | 60 | 60 | Δ | 60 | 57.5 | 62.5 |
| 2.5 | 60 | 62.6 | ○ | 57.5 | 57.5 | 65 |
| 2.5 | 65 | 65 | ○ | 50 | 62.5 | 67.5 |
| 2.5 | 65 | 67.5 | ○ | 47.5 | 62.5 | 70 |
| 2.5 | 70 | 70 | ○ | 40 | 67.5 | 72.5 |
| 2.5 | 70 | 72.5 | ○ | 37.5 | 67.5 | 75 |
| 2.5 | 75 | 75 | ○ | 30 | 72.5 | 77.5 |
| 2.5 | 75 | 77.5 | ○ | 27.5 | 72.5 | 80 |
| 2.5 | 80 | 80 | ○ | 20 | 77.5 | 82.5 |
| 2.5 | 80 | 82.5 | ○ | 17.5 | 77.5 | 85 |
| 2.5 | 85 | 85 | ○ | 10 | 82.5 | 87.5 |
| 2.5 | 85 | 87.5 | ○ | 7.5 | 82.5 | 90 |
| 2.5 | 90 | 90 | ○ | 0 | 87.5 | 92.5 |

From Table 2, it can be seen that when the angle $\theta_5$ formed by the first mesh patterns 850 of the EMI shielding layer and the top end of the EMI shielding layer is 25 to 60 degrees, the Moire phenomenon can be reduced, and when the angle $\theta_5$ is 30 to 55 degrees, the Moire phenomenon can be effectively prevented. It can also be seen that when the angle $\theta_4$ formed by the second mesh patterns 860 of the EMI shielding layer and the top end of the EMI shielding layer is 27.5 to 60 degrees, the Moire phenomenon can be reduced, and when the angle $\theta_4$ is 32.5 to 55 degrees, the Moire phenomenon can be effectively prevented.

Incidentally, it can be seen that when the dihedral angle $\theta_8$ formed by the first mesh patterns 850 of the EMI shielding layer and the second mesh patterns 860 is 60 to 127.5 degrees, the Moire phenomenon can be reduced, and when the dihedral angle $\theta_8$ is 70 to 117.5 degrees, the Moire phenomenon can be effectively prevented. When the dihedral angle $\theta_6$ formed by the first mesh patterns 850 of the EMI shielding layer and the patterns 840 of the external light shielding sheet is 22.5 to 57.5 degrees, the Moire phenomenon can be reduced, and when the dihedral angle $\theta_8$ is 27.5 to 52.5 degrees, the Moire phenomenon can be effectively prevented. In addition, when the dihedral angle $\theta_7$ formed by the second mesh patterns 860 of the EMI shielding layer and the patterns 840 of the external light shielding sheet is 30 to 62.5 degrees, the Moire phenomenon can be reduced, and when the dihedral angle $\theta_7$ is 35 to 57.5 degrees, the Moire phenomenon can be effectively prevented.

The following Table 3 is an experimental result on whether the Moire phenomenon has occurred or not and external light shielding effect, depending on the ratio of the bottom width D1 of the pattern unit of the external light shielding sheet and the width of the bus electrode formed in the front substrate of the panel. In this case, the width of the bus electrode was 90 μm.

TABLE 3

| Bottom Width of Pattern Unit/Bus Electrode Width | Moire | External Light Shielding |
|---|---|---|
| 0.10 | Δ | × |
| 0.15 | Δ | × |
| 0.20 | × | Δ |
| 0.25 | × | ○ |
| 0.30 | × | ○ |
| 0.35 | × | ○ |
| 0.40 | × | ○ |
| 0.45 | Δ | ○ |
| 0.50 | Δ | ○ |
| 0.55 | ○ | ○ |
| 0.60 | ○ | ○ |

From Table 3, it can be seen that the width D1 of the bottom end of the pattern unit is 0.2 to 0.5 times the bus electrode width, the Moire phenomenon can be reduced, and external light incident on the panel can be reduced. In order to prevent the Moire phenomenon and effectively shield external light while securing the aperture ratio for discharging the panel light, it is preferred that the width D1 of the bottom end of the pattern unit be 0.25 to 0.4 times the bus electrode width.

The following Table 4 is an experimental result on whether the Moire phenomenon has occurred and the external light shielding effect, depending on the ratio of the bottom width D1 of the pattern unit of the external light shielding sheet and the width of the longitudinal barrier rib formed in the rear substrate of the panel. In this case, the width of the longitudinal barrier rib was 50 μm.

TABLE 4

| Bottom Width of Pattern Unit/Top Width of Longitudinal Barrier Rib | Moire | External Light Shielding |
|---|---|---|
| 0.10 | ○ | × |
| 0.15 | Δ | × |
| 0.20 | Δ | × |
| 0.25 | Δ | × |
| 0.30 | × | Δ |
| 0.35 | × | Δ |
| 0.40 | × | ○ |
| 0.45 | × | ○ |
| 0.50 | × | ○ |
| 0.55 | × | ○ |
| 0.60 | × | ○ |
| 0.65 | × | ○ |
| 0.70 | Δ | ○ |
| 0.75 | Δ | ○ |
| 0.80 | Δ | ○ |
| 0.85 | ○ | ○ |
| 0.90 | ○ | ○ |

From Table 4, it can be seen that when the width D1 of the bottom end of the pattern unit is 0.3 to 0.8 times the width of the longitudinal barrier rib, the Moire phenomenon can be reduced, and external light incident on the panel can be reduced. In order to prevent the Moire phenomenon and also effectively shield external light while securing the aperture ratio for discharging the panel light, it is preferred that the width D1 of the bottom end of the pattern unit is 0.4 to 0.65 times the width of the longitudinal barrier rib.

FIGS. 18 to 21 are cross-sectional views showing embodiments of the structure of an external light shielding sheet to which an Anti-Reflection (AR) layer, a Near Infrared (NIR) shielding layer, the EMI layer, etc. are attached according to an embodiment of the present invention. The filter formed on the front of the PDP may include an AR/NIR sheet, an EMI shielding sheet, an external light shielding sheet, an optical characteristic sheet, and so on.

Figure 18:
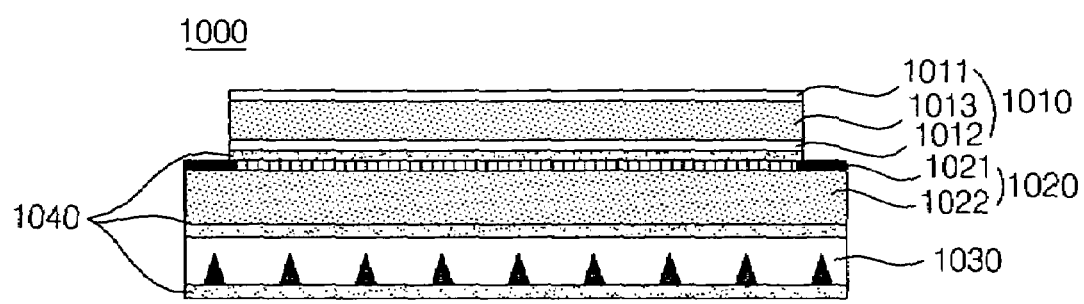
FIGS. 18 to 21 are cross-sectional views showing embodiments of the structure of an external light shielding sheet to which an Anti-Reflection (AR) layer, a Near Infrared (NIR) shielding layer, the EMI layer, etc. are attached according to an embodiment of the present invention.
Figure 19:
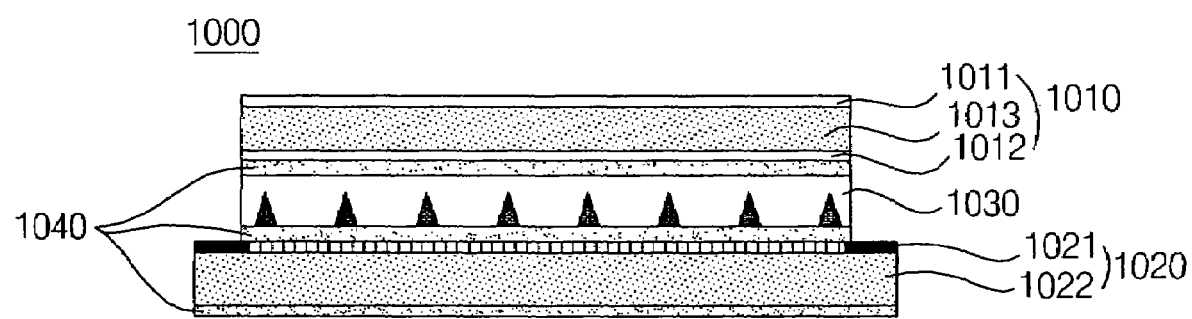

Referring to FIGS. 18 and 19, an AR/NIR sheet 1010 includes an AR layer 1011 disposed at the front of a base sheet 1013 made of a transparent plastic material, and a NIR shielding layer 1012 disposed at the rear of the base sheet 1013. The AR layer 1011 serves to prevent externally incident light from reflecting, thus reducing a glairing phenomenon. The NIR shielding layer 1012 serves to shield NIR radiated from the panel, so that signals transferred using infrared rays, such as a remote controller, can be transferred normally.

The base sheet 1013 may be formed using a variety of materials by taking use conditions or transparence, an insulating property, a heat-resistance property, mechanical strength, etc. into consideration. For example, the materials of the base sheet 1013 may include poly polyester-based resin, polyamid-based resin, polyolefin-based resin, vinyl-based resin, acryl-based resin, cellulose-based resin, and so on. In general, it is preferred that the base sheet 1013 be formed using a polyester-based material, such as polyethylene tereophthalate (PET) and polyethylene naphthalate (PEN) having a good transparency and transmittance of a visible ray of 80% or more. The thickness of the base sheet 1013 may be preferably set in the range of 50 to 500 μm considering that it can prevent damage to the sheet by overcoming weak mechanical strength and it can save cost by having an necessary thickness.

The EMI shielding sheet 1020 includes an EMI shielding layer 1021 disposed at the front of a base sheet 1022 made of a transparent plastic material. The EMI shielding layer 1021 functions to shield EMI, thereby preventing EMI, radiated from the panel, from being emitting externally. In general, the EMI shielding layer 1021 is formed to have a mesh structure using a conductive material. In order for the ground to be performed smoothly, a conductive material is entirely coated on an invalid display region of the EMI shielding sheet 1020 on which an image is not displayed.

It is preferred that the EMI shielding layer 1021 have a pattern width of 10 to 30 μm. In this case, a sufficient electrical resistance value for EMI shielding can be obtained, and the aperture ratio for an adequate optical transmittance can be secured.

In general, an external light source exists in a room or in the outside, or over the head of a viewer. In order to make further dark a black image of the PDP by effectively shielding such external light, an external light shielding sheet 1030 is attached.

An adhesive 1040 is formed between the AR/NIR sheet 1010, the EMI shielding sheet 1020, and the external light shielding sheet 1030, so that each of the sheets 1010, 1020 and 1030 and the filter 1000 can be firmly adhered on the front of the panel. It is preferred that the base sheets included between the respective sheets 1010, 1020 and 1030 be formed using substantially the same material by taking the easiness of fabrication of the filter 1000 into consideration.

Meanwhile, it has been shown in FIG. 18 that the AR/NIR sheet 1010, the EMI shielding sheet 1020 and the external light shielding sheet 1030 are sequentially laminated. However, as illustrated in FIG. 19, the AR/NIR sheet 1010, the external light shielding layer 1030, and the EMI shielding sheet 1020 may be laminated in this sequence. Furthermore, the lamination sequence of the respective sheets may be changed by those skilled in the art. Incidentally, at least one of the sheets 1010, 1020 and 1030 may be omitted.

Figure 20:
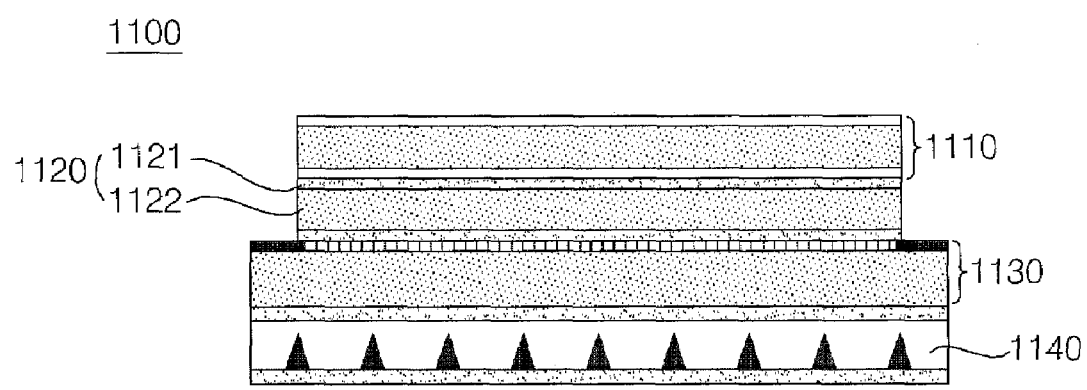
Figure 21:
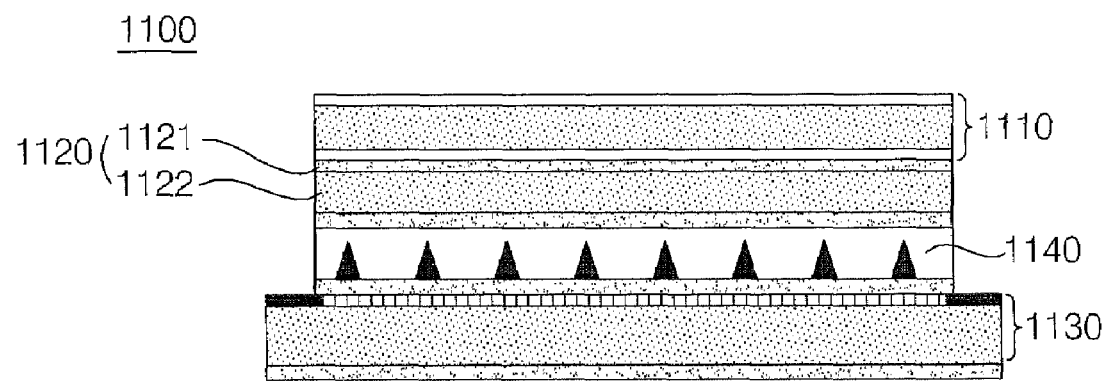

Referring to FIGS. 20 and 21, a filter 1100 formed at the front of the panel may further include an optical characteristic sheet 1120 in addition to the AR/NIR sheet 1110, the EMI shielding sheet 1130 and the external light shielding sheet 1140 as illustrated in FIGS. 18 and 19. The optical characteristic sheet 1120 functions to improve color temperature of light incident from the panel and a luminance characteristic. The optical characteristic sheet 1120 includes a base sheet 1122 made of a transparent plastic material, and an optical characteristic layer 1121 made of dyes and an adhesive and laminated at the front or rear of the base sheet 1122.

At least one of the base sheets shown in FIGS. 18 to 21 may be omitted. At least one of the base sheets may be formed using glass not a plastic material in order to improve the function of protecting the panel. It is preferred that the glass be spaced apart from the panel at a given distance.

The filter according to an embodiment of the present invention may further include a diffusion sheet. The diffusion sheet functions to diffuse incident light in order for the light to maintain a uniform brightness. Thus, the diffusion sheet can diffuse light radiated from the panel uniformly, so that upper and lower viewing angles of the display screen can be widened and patterns formed in the external light shielding sheet, etc. can be concealed. The diffusion sheet condenses light in a direction corresponding to the upper and lower viewing angles, thereby making uniform and improving a front luminance, and also improving a charging prevention characteristic.

The diffusion sheet may include a transmission type, a reflection type diffusion film or the like. In general, the diffusion sheet may have small glass bead grains mixed in the base sheet made of a polymer material. The base sheet of the diffusion sheet may be formed using a high purity acrylic resin such as polymethyl methacrylate (PMMA). In the case where PMMA is used, the thickness of the sheet is thick, whereas the heat-resistant property is good. Accordingly, the base sheet can be applied to a large-sized display apparatus generating lots of heat.

INDUSTRIAL APPLICABILITY

In accordance with the plasma display apparatus constructed above according to the present invention, the external light shielding sheet configured to absorb and shield externally incident light to the greatest extent is disposed at the front of the panel. It is thus possible to effectively implement a black image, and to improve bright and dark room contrast.

Patterns of the external light shielding sheet are formed with inclination. It can reduce the occurrence of the Moire phenomenon. The EMI shielding sheet of a mesh fashion is attached to the external light shielding sheet. External light can be shielded and an EMI shielding effect can be improved.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

The invention claimed is:
1. A plasma display apparatus, comprising:
a Plasma Display Panel (PDP); and
a filter formed at the front of the panel, wherein the filter comprises:
an external light shielding sheet including a first base unit, and first pattern units formed in the first base unit; and
an Electromagnetic Interference (EMI) shielding sheet including second pattern units,
wherein a thickness of the external light shielding sheet is 1.01 to 2.25 times greater than a h eight of each of the first pattern units, and
an angle formed by the first pattern units and the second pattern units is set in the range of 20 to 65 degrees.

2. The plasma display apparatus of claim 1, wherein a reflective index of the first pattern unit is lower than that of the first base unit.

3. The plasma display apparatus of claim 1, wherein the thickness of the external light shielding sheet is 1.01 to 1.5 times greater than the height of the first pattern unit.

4. The plasma display apparatus of claim 1, wherein:
the EMI shielding sheet comprises third pattern units crossing the second pattern units, and
an angle formed by the second pattern unit and the third pattern unit is set in the range of 60 to 130 degrees.

5. The plasma display apparatus of claim 1, wherein:
the panel comprises a bus electrode, and
a bottom width of each of the first pattern units disposed on the panel side is 0.2 to 0.5 times greater than a width of the bus electrode.

6. The plasma display apparatus of claim 1, wherein:
the panel includes a longitudinal barrier rib crossing a first electrode, and
a bottom width of the first pattern unit is 0.3 to 0.8 times greater than a width of the longitudinal barrier rib.

7. A plasma display apparatus, comprising:
a PDP; and
a filter formed at the front of the panel,
wherein the filter comprises:
an external light shielding sheet including a first base unit, and first pattern units formed in the first base unit; and
an EMI shielding sheet including second pattern units and third pattern units,
wherein the second and third pattern units cross each other, an angle formed by the first pattern unit and the second pattern unit ranges from 20 to 60 degrees, and an angle formed by the first pattern units and the third pattern unit ranges from 28 to 65 degrees.

8. The plasma display apparatus of claim 7, wherein a reflective index of the first pattern unit is lower than that of the first base unit.

9. The plasma display apparatus of claim 7, wherein an angle formed by the second pattern unit and the third pattern unit ranges from 60 to 130 degrees.

10. The plasma display apparatus of claim 7, wherein a thickness of the external light shielding sheet is 1.01 to 2.25 times greater than a height of the first pattern unit.

11. The plasma display apparatus of claim 7, wherein a thickness of the external light shielding sheet is 1.01 to 2.25 times greater than a height of the first pattern unit.

12. The plasma display apparatus of claim 7, wherein:
the panel comprises a bus electrode, and
a bottom width of each of the first pattern units disposed on the panel side is 0.2 to 0.5 times greater than a width of the bus electrode.

13. The plasma display apparatus of claim 7, wherein:
the panel includes a longitudinal barrier rib crossing a first electrode, and
a bottom width of the first pattern unit is 0.3 to 0.8 times greater than a width of the longitudinal barrier rib.

14. A filter comprising:
an external light shielding sheet including a first base unit, and first pattern units formed in the first base unit; and
an EMI shielding sheet including second pattern units,
wherein a thickness of the external light shielding sheet is 1.01 to 2.25 times greater than a height of each of the first pattern units, and
an angle formed by the first pattern units and the second pattern units is set in the range of 20 to 65 degrees.

15. The filter of claim 14, wherein a reflective index of the first pattern unit is lower than that of the first base unit.

16. The filter of claim 14, wherein an angle formed by the first pattern unit and the second pattern unit is set in the range of 27 to 58 degrees.

17. The filter of claim 14, wherein an angle formed by the first pattern unit and the second pattern unit is set in the range of 40 to 50 degrees.

18. The filter of claim 14, wherein an angle formed by the first pattern unit and a top end or bottom end of the external light shielding sheet is set within a range of 0.5 to 9 degrees.

19. The filter of claim 14, wherein an angle formed by the first pattern unit and a top end or bottom end of the external light shielding sheet is set within a range of 0.5 to 4.5 degrees.

20. The filter of claim 14, wherein an angle formed by the second pattern unit and a top end or bottom end of the EMI shielding sheet is set within a range of 25 to 60 degrees.

21. The filter of claim 14, wherein an angle formed by the second pattern unit and a top end or bottom end of the EMI shielding sheet is set within a range of 30 to 55 degrees.

22. The filter of claim 14, wherein a reflective index of the first pattern units is 0.3 to 0.999 times greater than that of the first base unit.

23. The filter of claim 14, wherein a thickness of the external light shielding sheet is 1.01 to 1.5 times greater than a height of the first pattern units.

24. The filter of claim 14, wherein the EMI shielding sheet comprises third pattern units crossing the second pattern units.

25. The filter of claim 24, wherein an angle formed by the second pattern unit and the third pattern unit is set in the range of 60 to 130 degrees.

26. The filter of claim 24, wherein an angle formed by the second pattern unit and the third pattern unit is set within a range of 70 to 118 degrees.

27. A filter comprising:
an external light shielding sheet including a first base unit, and first pattern units formed in the first base unit; and
an EMI shielding sheet including second pattern units and third pattern units,
wherein the second and third pattern units cross each other, an angle formed by the first pattern unit and the second pattern unit ranges from 20 to 60 degrees, and an angle formed by the first pattern units and the third pattern unit ranges from 28 to 65 degrees.

28. The filter of claim 27, wherein a reflective index of the first pattern unit is lower than that of the first base unit.

29. The filter of claim 27, wherein an angle formed by the first pattern unit and the second pattern unit is set in the range of 27 to 58 degrees.

30. The filter of claim 27, wherein an angle formed by the first pattern unit and the second pattern unit is set in the range of 40 to 50 degrees.

31. The filter of claim 27, wherein an angle formed by the first pattern unit and the third pattern unit is set within a range of 40 to 50 degrees.

32. The filter of claim 27, wherein a reflective index of the first pattern units is 0.3 to 0.999 times greater than that of the first base unit.

33. The filter of claim 27, wherein an angle formed by the second pattern unit and the third pattern unit is set in the range of 60 to 130 degrees.

34. The filter of claim 27, wherein an angle formed by the second pattern unit and the third pattern unit is set in the range of 70 to 118 degrees.

35. The filter of claim 27, wherein at least one of the second and third pattern units has a width of 5 to 15 μm.

36. The filter of claim 27, wherein a thickness of the external light shielding sheet is 1.01 to 2.25 times greater than a height of the first pattern unit.

37. The filter of claim 27, wherein a thickness of the external light shielding sheet is 1.01 to 1.5 times greater than a height of the first pattern unit.

* * * * *